United States Patent [19]
Park et al.

[11] Patent Number: 5,296,400
[45] Date of Patent: Mar. 22, 1994

[54] METHOD OF MANUFACTURING A CONTACT OF A HIGHLY INTEGRATED SEMICONDUCTOR DEVICE

[75] Inventors: Cheol-Soo Park, Kyoungki; Yo-Hwan Koh; Jae-Beom Park, both of Seoul; Young-Jin Park, Kyoungki; Jin-Seong Oh, Seoul, all of Rep. of Korea

[73] Assignee: Hyundai Electronics Industries Co., Ltd., Kyoungki, Rep. of Korea

[21] Appl. No.: 989,196

[22] Filed: Dec. 11, 1992

[30] Foreign Application Priority Data
Dec. 14, 1991 [KR] Rep. of Korea ............ 91-22977
Dec. 31, 1991 [KR] Rep. of Korea ............ 91-25621

[51] Int. Cl.⁵ .......................................... H01L 21/70
[52] U.S. Cl. .................................. 437/52; 437/47; 437/48; 437/60; 437/193; 437/235
[58] Field of Search ............. 437/47, 48, 52, 60, 437/228, 235, 919, 193

[56] References Cited

U.S. PATENT DOCUMENTS

| | | | |
|---|---|---|---|
| 4,792,534 | 12/1988 | Tsuji et al. | 437/228 |
| 4,957,881 | 9/1990 | Crotti | 437/228 |
| 4,997,790 | 5/1991 | Woo et al. | 437/228 |
| 5,200,358 | 4/1993 | Bollinger et al. | 437/228 |

FOREIGN PATENT DOCUMENTS 178129 8/1991 Japan .

Primary Examiner—Tom Thomas
Attorney, Agent, or Firm—Merchant, Gould, Smith, Edell, Welter & Schmidt

[57] ABSTRACT

When contacting a bit line and a charge storage electrode to a source/drain of the MOS transistor during a manufacturing process of a highly integrated semiconductor device, a contact pad is formed by filling up polysilicon into a contact hole that had been made using a self-align method in order not to damage the word line or the bit line as a result of a small processing margin during a contact hole forming process. Also, the occurrence of a topological difference during a semiconductor manufacturing process is minimized by forming an oxide layer such as SOG, BPSG, TEOS, and PECVD oxide over the top of the field oxide for a flattening effect.

24 Claims, 7 Drawing Sheets

METHOD OF MANUFACTURING A CONTACT OF A HIGHLY INTEGRATED SEMICONDUCTOR DEVICE

BACKGROUND OF THE INVENTION

This invention relates to manufacturing processes of a highly integrated semiconductor device, and more particularly to a method of manufacturing a contact of a highly integrated semiconductor device using a self-aligned contact structure which is a relatively simple process.

The area occupied by a unit cell decreases as integration of the semiconductor device increases. Accordingly, in order to reduce the area occupied by a cell, width of a word line and a bit line and space between lines must be reduced further. However, in the highly integrated devices such as 64M DRAM (Dynamic Random Access Memory) which has design rule of 0.4 $\mu$m or less, maximum permissible line space is very small and, thus, the formation of a bit line contact or a contact for the storage node using conventional direct contact methods is not as easy as it appears.

That is why most manufacturers use a self-aligned contact method. However, even if this method is used, an etching process becomes very difficult because an aspect ratio increases drastically during a contact etching process as integration of the device increases. Also, problems such as short between the word line and bit line or between the bit line and the charge storage node as well as breaking of the wiring metal line occur. Furthermore, the resistance increases at this time.

SUMMARY OF THE INVENTION

The object of the present invention is to provide a contact manufacturing method without the above mentioned problems which can minimize a topological difference while manufacturing a contact. This is achieved by forming a contact pad within a contact hole located between word lines which has been manufactured using a self-aligned contact method and by forming oxide layers such as SOG (Spin-On-Glass), BPSG (Boro-Phospho-Silicate Glass), TEOS, and PECVD (Plasma Enhanced Chemical Vapor Deposition) oxide used for flattening on top of a field oxide layer.

In accordance with one embodiment of the present invention, the invention method includes the steps of:

Forming a field oxide and a MOS transistor having gate, source, and drain electrodes on a silicon substrate; forming a first insulating layer that entirely covers said MOS transistor and field oxide; forming a polyimide pattern only on the contact area located on top of the source and drain after coating a photosensitive polyimide flatly over the first insulating layer; forming a second insulating layer thickly over the entire structure that includes said polyimide pattern after forming the second insulating layer having a certain thickness and then forming a second insulating layer pattern flatly by carrying out an etching process until the top surface of said polyimide pattern is completely exposed; removing the exposed polyimide pattern using a plasma etching process; forming a spacer on the side wall of the gate electrode by carrying out a blanket etching process on the first insulating layer that has been exposed by said plasma etching process while simultaneously forming a contact area having an exposed source and drain; forming several polysilicon pads which are in contact with the drain and source by carrying out an etch back process until the top surface of said second insulating layer is completely exposed after depositing a polysilicon layer over the entire structure; depositing a third insulating layer over the entire structure that includes said polysilicon pad; and depositing a conducting layer that is in contact with the polysilicon pad over the area where the polysilicon pad is exposed by removing the third insulating layer of the area that had been selected as a contact area so that a conducting layer to be deposited on top can contact the source or drain through the polysilicon pad in the contact hole.

In accordance with another embodiment of the present invention, there is a method comprising the steps of:

Forming a MOS transistor having gate, source and drain electrode, and a field oxide on a silicon substrate; forming a fifth insulating layer that completely covers said MOS transistor and field oxide; forming a sixth insulating layer flatly over the fifth insulating layer and etching the sixth insulating layer until the top surface of the fifth insulating layer is adequately exposed by carrying out an etch back process in which the etch selectivity to the sixth insulating layer is higher than that of the fifth insulating layer; depositing a seventh insulating layer over the entire structure and forming a seventh insulating layer pattern with the seventh insulating layer of the contact areas of the bit line and the charge storage node removed through a mask patterning process; forming an eighth insulating layer spacer on the side wall of the seventh insulating pattern; forming a contact hole by removing the fifth insulating layer which is located just below said sixth insulating layer by carrying out a blanket etching process after removing the sixth insulating layer that has been exposed; and depositing a doped polysilicon layer thickly over the top of the entire structure that includes said contact hole and etching back the doped polysilicon layer to form a polysilicon contact pad on the contact hole.

BRIEF DESCRIPTION OF THE DRAWINGS

The novel features characteristic of the invention are set forth in the appended claims. The invention itself, however, as well as other features and advantages thereof, will be best understood by reference to the detailed description which follows, read in conjunction with the accompanying drawings, where in:

DETAILED DESCRIPTION OF THE PREFERRED EMBODIMENTS

First, by referring to FIG. 1A through FIG. 1F, one embodiment of the invention would be described.

Figure 1A:
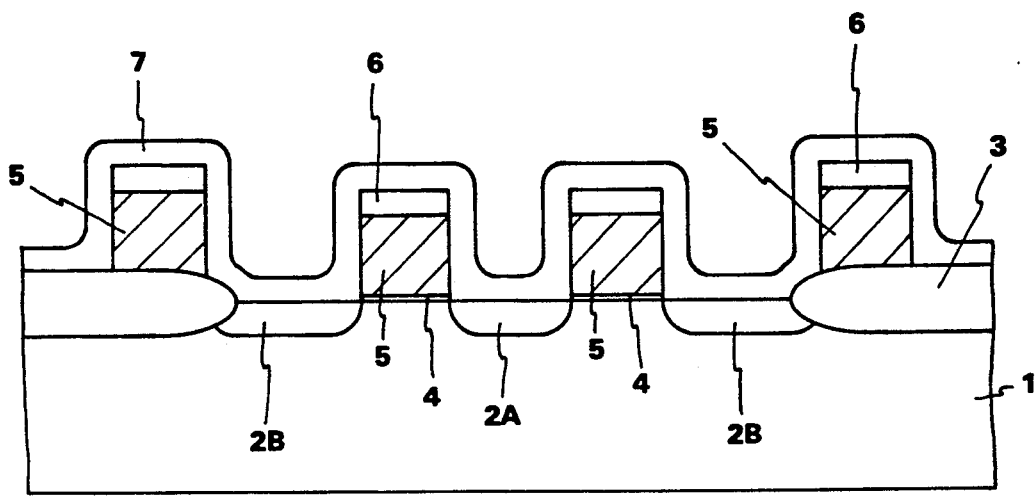
FIG. 1A through FIG. 1F are cross-sectional views that illustrate a process of forming a contact of highly integrated semiconductor device in accordance with one embodiment of the present invention.

FIG. 1A illustrates the formation of a field oxide layer 3, a gate oxide layer 4, a source/drain 2A,2B, a gate electrode 5, a mask oxide 6 for the gate electrode on a silicon substrate 1 and the formation of the first insulating layer 7, for example oxide layer, over top of the entire structure.

Figure 1B:
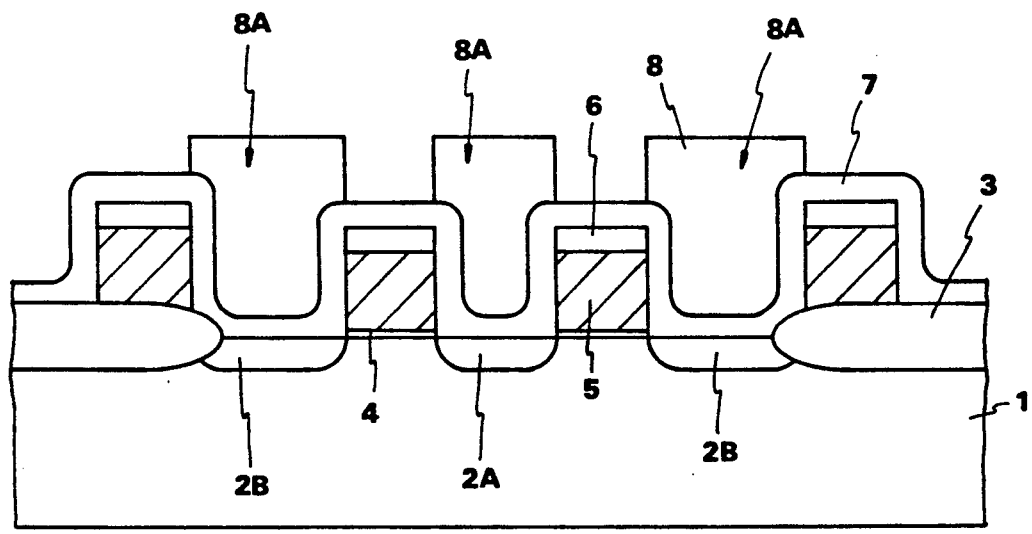

As shown in FIG. 1B, a photo-sensitive polyimide 8 is coated over the entire structure and then a certain amount of polyimide 8 is removed using an exposure and a development process. Finally, a polyimide pattern 8A is created by leaving a polyimide 8 on the contact areas of the bit line and the charge storage node. At this time, it should be noted that a photoresist instead of the photosensitive polyimide 8 can be used.

Figure 1C:
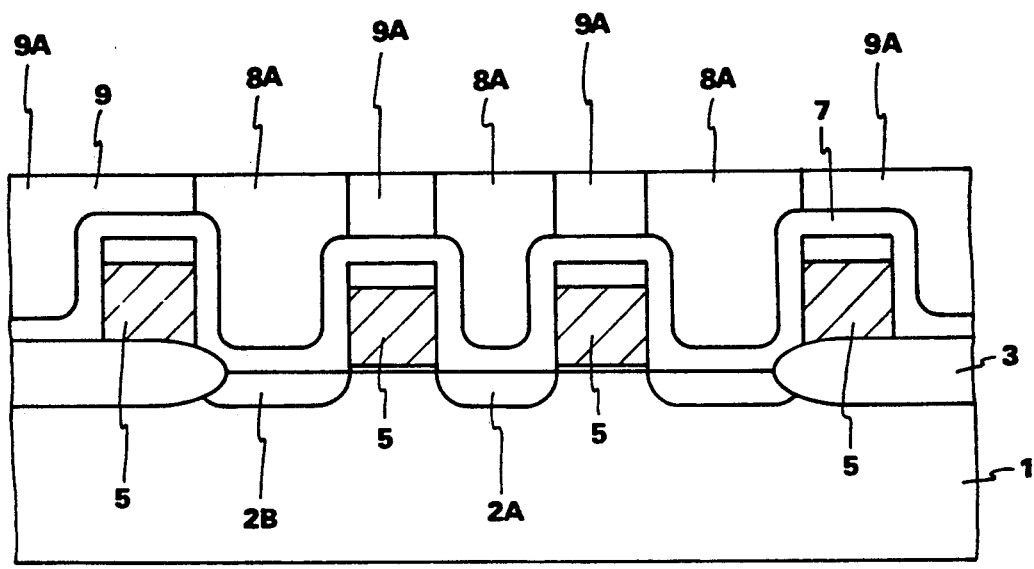

Next, as illustrated in FIG. 1C, a second insulating layer 9 such as a LTO (Low Temperature Oxide), a PECVD (Plasma Enhanced Chemical Vapor Deposition) oxide, a SOG (Spin-On-Glass), a BPSG (Boro-Phospho-Silicate Glass), or a TEOS is formed thickly over the entire structure and then an etch back process is carried out until the top surface of said polyimide pattern 8A is exposed thereby, forming the second insulating pattern 9A which is flat.

Figure 1D:
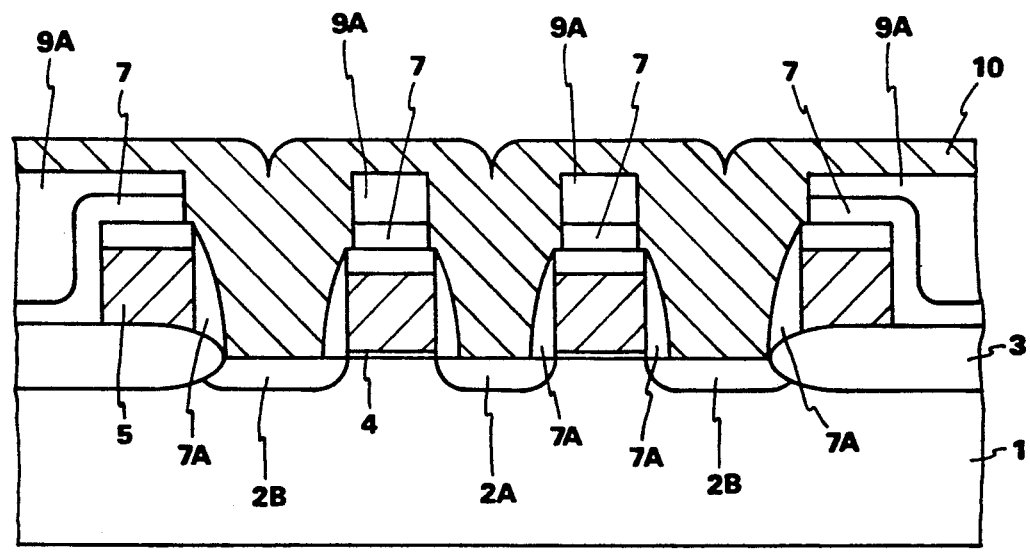

Next, the polyimide pattern 8A on top of a source and a drain 2A and 2B which are to be used as the contact areas for the bit line, and the charge storage node later are removed via a plasma etching process. Then, the drain and the source 2A and 2B are exposed and a first insulating layer spacer 7A is left on the side wall of the gate electrode 5 by removing the first insulating layer 7 of the lower part of the polyimide pattern 8A that has been exposed by the above plasma etching process. Then, a thick polysilicon layer 10 is deposited over the entire structure that has been exposed. This is shown in FIG. 1D. The polysilicon layer 10 is contacted to the source/drain 2A, 2B and is used as a contact pad during later processes.

As a next step, up to the top surface of said second insulating layer 9, the polysilicon layer 10 is removed via an etch back process to form several polysilicon pads 10A that are in contact with the source/drain 2A, 2B respectively. After depositing an insulating layer 11 over the top of the entire structure, said insulating layer 11 is patterned via a bit line contact mask (not illustrated in the drawing) process to expose the contact pad 10A connected to the source 2A.

Figure 1E:
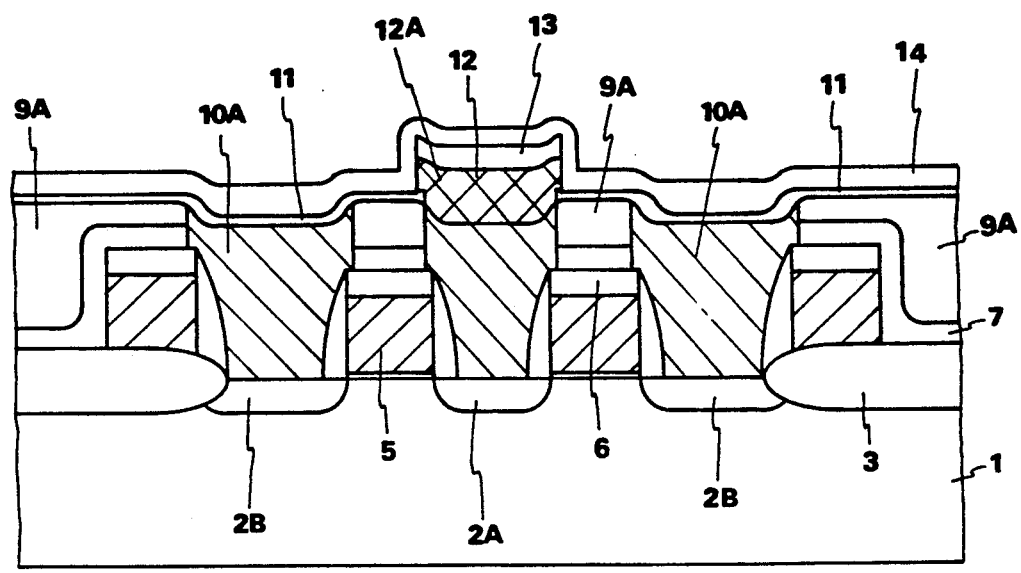

Then, a conducting layer made of, for example, polyimide material is formed over the entire structure and on top of it, a third insulating layer 13, for example, oxide layer is deposited. Next, a bit line 12 and an oxide pattern 13A used for the bit line mask are created by carrying out the patterning via a bit line mask process that is not illustrated. Then, a fourth insulating layer 14 is formed over the entire structure as shown in FIG. 1E.

Figure 1F:
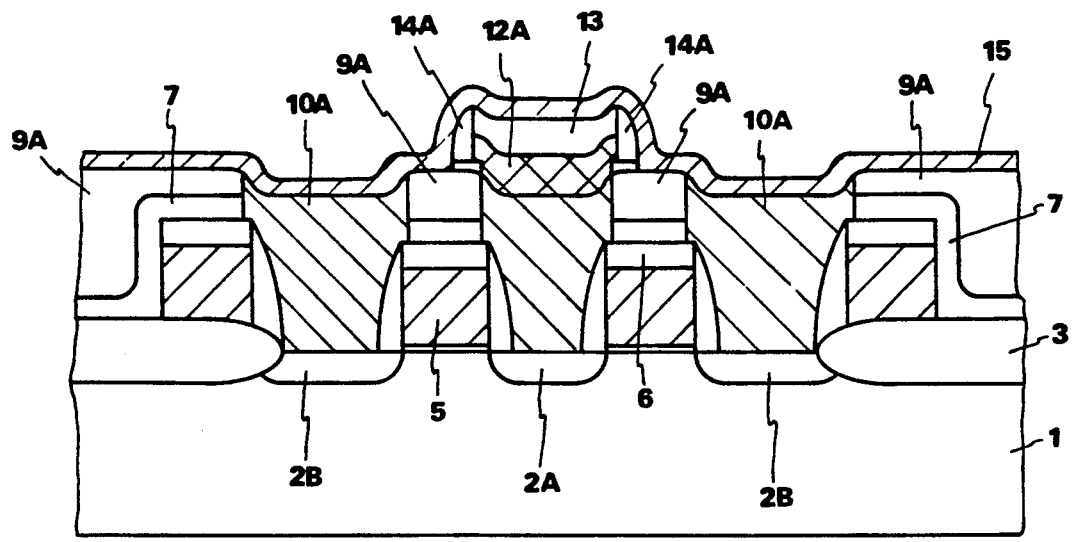

Next, via a blanket etch processing on the fourth insulating layer 14, a spacer 14A is formed on the side wall of the bit line 12A. An etching process carried out at this time is an over etching process that exposes the polysilicon pad 10A connected to the drain 2B. Then, on top of it, a conducting layer 15 for the charge storage node is deposited. This process is illustrated in FIG. 1F. Later, the processes of forming a charge storage node, a dielectric, and a plate electrode are carried out by using a well known technology.

In the coming section, the second embodiment of the present invention is described by referring to FIG. 2A through FIG. 2H.

Figure 2A:
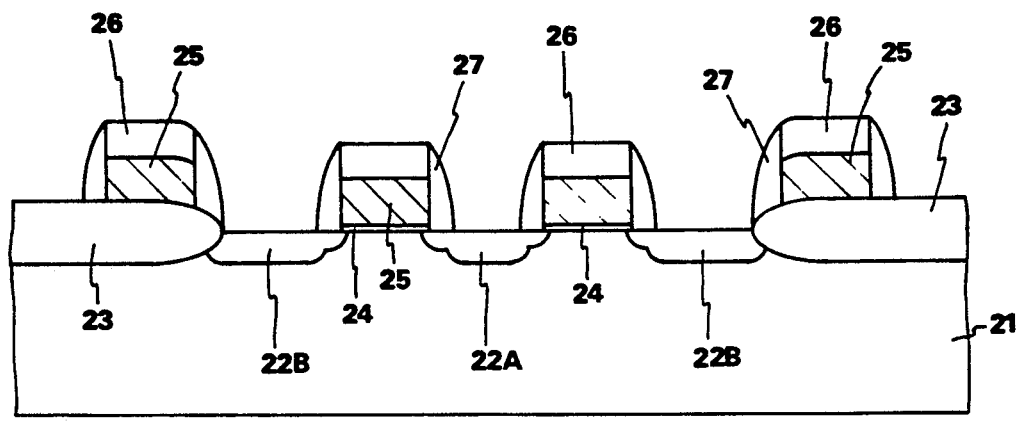
FIG. 2A through FIG. 2H are cross-sectional views that illustrate a process of forming a contact of highly integrated semiconductor device in accordance with another embodiment of the present invention.

FIG. 2A shows the formation of a field oxide layer 23, a gate oxide layer 24, a gate electrode 25, a mask oxide layer 26, a spacer oxide 27, and a source/drain 22A, 22B on a silicon substrate 21.

Figure 2B:
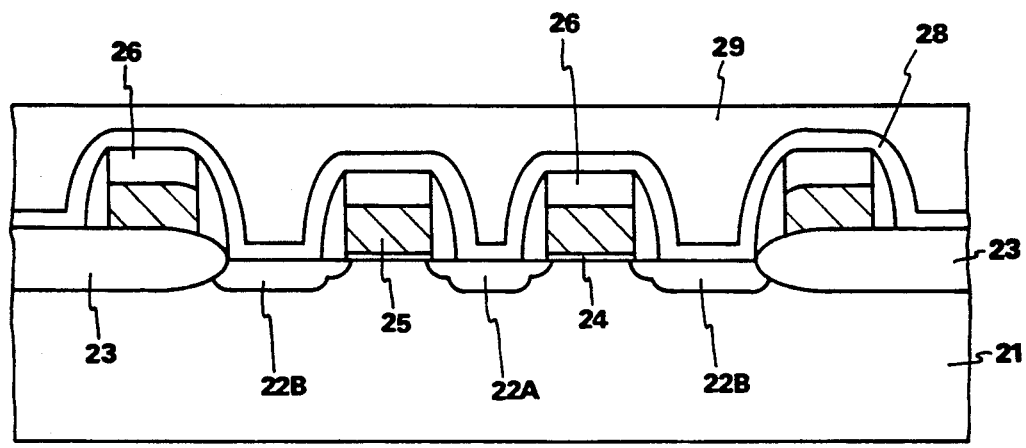

As shown in FIG. 2B, a first insulating layer 28 having certain thickness is formed over the entire structure and then a second insulating layer 29 having certain thickness is deposited and flows smoothly. Silicon oxide or silicon nitride can be used as the material for the first insulating layer. For the second insulating layer, BPSG is preferable in consideration of the etch selection ratio between the second insulating layer and the first insulating layer.

Next, the BPSG layer 29 is etched back until it becomes lower than the top surface of the first insulating layer 28 formed over the mask oxide layer 26 using a cleaning process with $NH_4OH$ or a HF (or BOE) dip process in order to leave the BPSG layer having certain thickness only on concave parts 29A between gate electrodes, the areas where the contact holes are to be formed later.

When the etching is carried out using a $NH_4OH$ cleaning or HF(or B.O.E) dip process, only the BPSG layer 29 is removed completely while a small portion of the silicon oxide or the silicon nitride layer 28 is etched because the etch selectivity to BPSG used for the second insulating layer is much higher than that of the silicon oxide or the silicon nitride used as the first insulating layer. For example, while carrying out a $NH_4OH$ cleaning process, the etch selection ratio between TEOS and BPSG is about 1:10–100 and between HTO and BPSG is approximately 1:100 or more. During a HF(or BOE) dip process, the etch selection ratio between silicon nitride and BPSG is 1:100 or more.

Figure 2C:
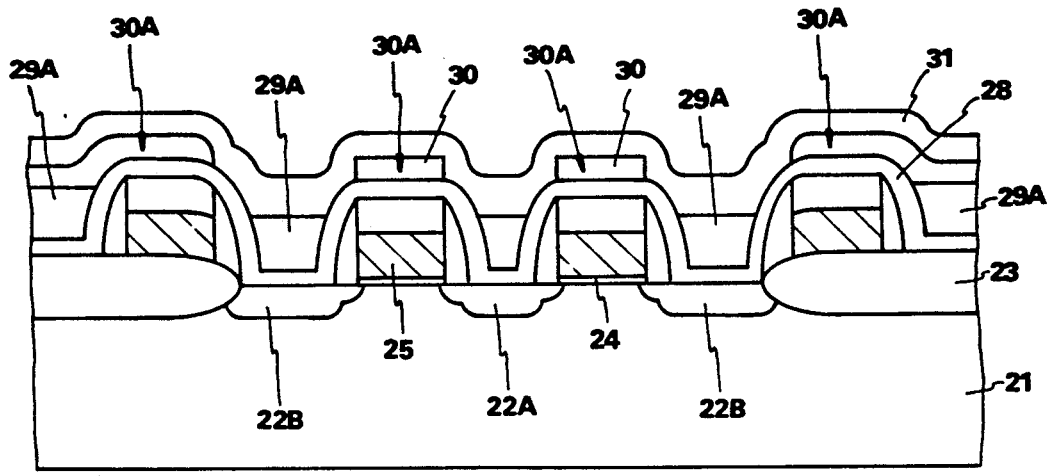

Next, a third insulating layer 30 that is made of the same material as the first insulating layer is deposited over the top of the entire structure and then the third oxide layer pattern 30A is formed by removing the silicon oxide layer 30 of the contact area of the bit line and the charge storage node via an etching process using a contact mask. Next, the photoresist that had been used as the contact mask is removed and then an fourth insulating layer 31 made of silicon oxide or silicon nitride is deposited over the entire structure as shown in FIG. 2C.

Figure 2D:
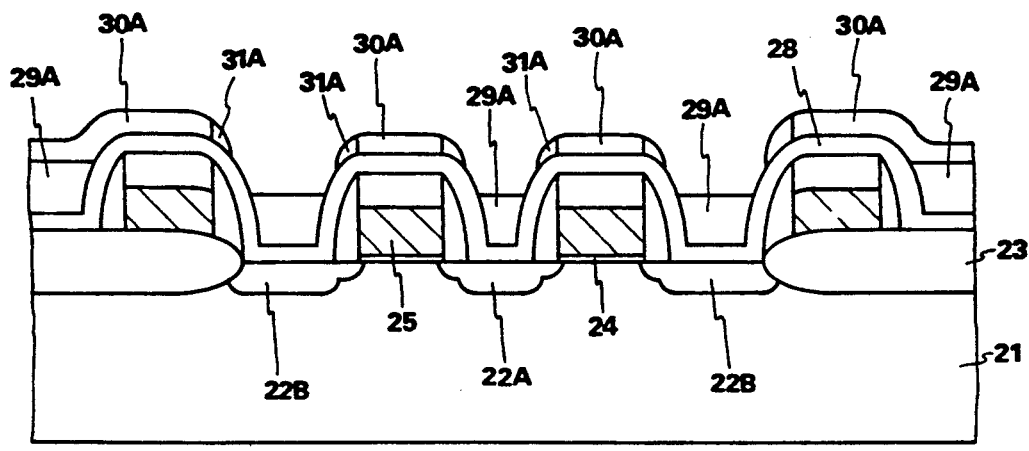

As shown in FIG. 2D, the fourth insulating layer 31 is etched to form an insulating layer spacer 31A on the side wall of the third insulating pattern 30A. At this time, the BPSG layer 29A located on the concave part of the contact area is removed until it reaches certain thickness. The oxide spacer 31A is used to reduce the contact size.

Figure 2E:
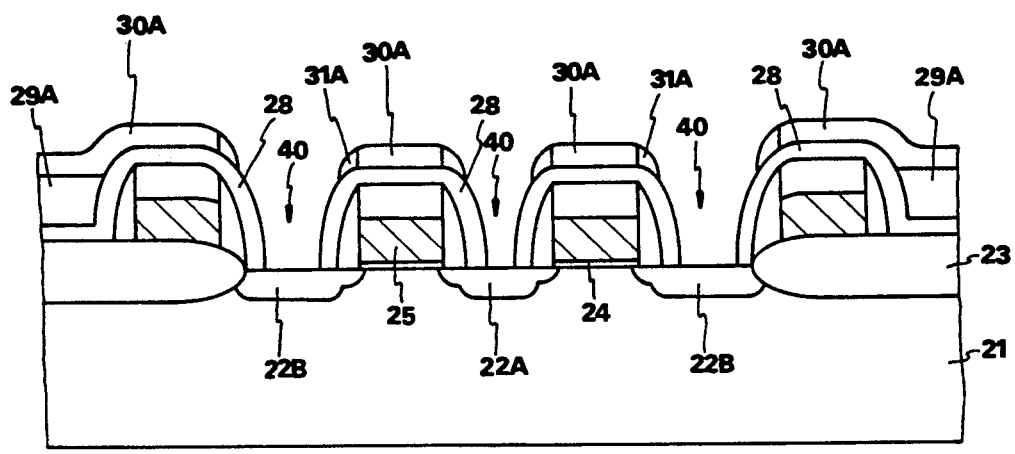

Next, the remaining BPSG layer 29A is removed via a $NH_4OH$ cleaning or HF dip process using the exposed first insulating layer 28, the third insulating layer pattern 30A, and the oxide spacer 31A as masks and then the first insulating layer 28 which is located below the BPSG layer 29A is removed via a blanket etching process, thereby to form contact hole 40 with the exposed source/drain 22A and 22B. This is illustrated in FIG. 2E.

Figure 2F:
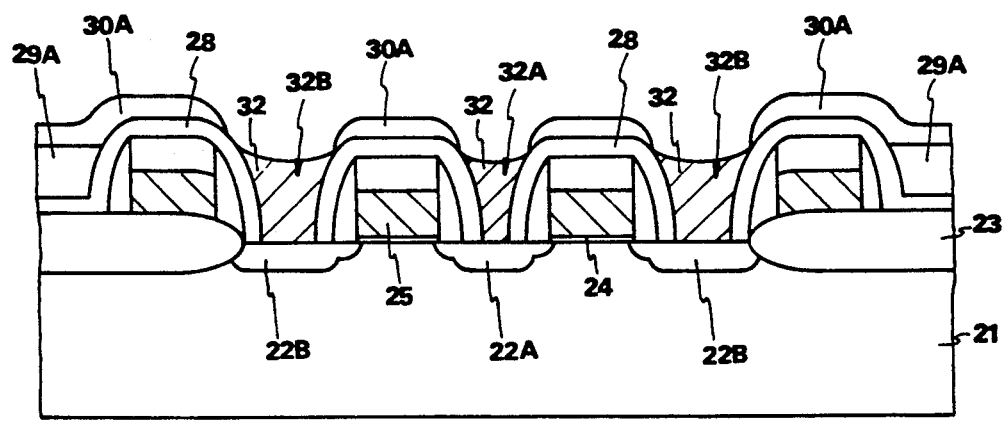

Next, a doped polysilicon layer 32 is deposited thickly over the top of the entire structure, including the contact hole 40, and then said doped polysilicon layer 32 is removed in such a way that it is left only on the concave part of top of the source and drain 22A and 22B of the contact area to form a contact pad 32A for the bit line and a contact pad 32B for the charge storage node. This process is illustrated in FIG. 2F. It should be noted that instead of the above deposit and etch back process, a selective growth method or an epitaxial growth method also can be used to form the polysilicon contact pad on top of said source and drain 22A and 22B.

Figure 2G:
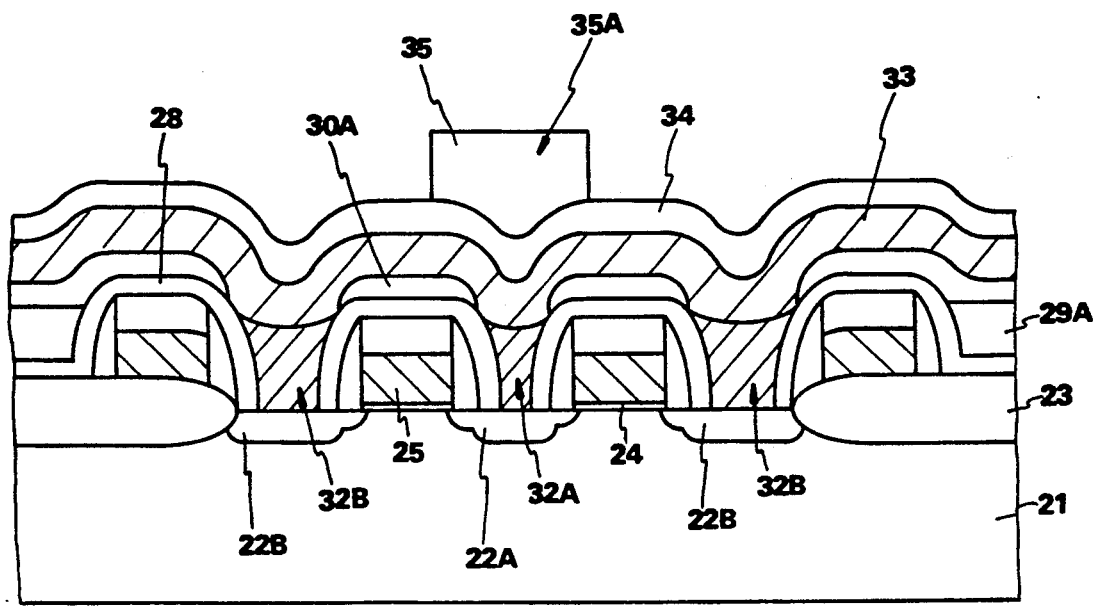

Next, As illustrated in FIG. 2G, a conducting layer 33 for the bit line and a mask oxide layer 34 for the bit line having certain thickness are respectively deposited over the top of the entire structure and then a photosensitive layer 35 is formed over its top. Then, a photo-sensitive layer pattern 35A is formed using a bit line mask. It should be noted that the conducting layer 33 for the bit line which is in contact with the contact pad 32A is patterned later and used as the bit line.

Next, an exposed mask oxide layer 34 and a conducting layer 33 for the bit line are respectively etched using said photo sensitive layer pattern 35A as a mask to form a mask oxide layer pattern 34A and a bit line 33A. Then, the photo-sensitive pattern 35A is removed. Then, a fifth insulating layer 36, for example, a silicon oxide layer 36 having a predetermined thickness is deposited over the entire structure including the mask oxide layer pattern 34A and then a second oxide spacer 36A is formed on the side walls of the bit line 33A and the mask oxide layer pattern 34A by carrying out a blanket etching process. At this time, the contact pad 32B for the charge storage node is exposed.

Figure 2H:
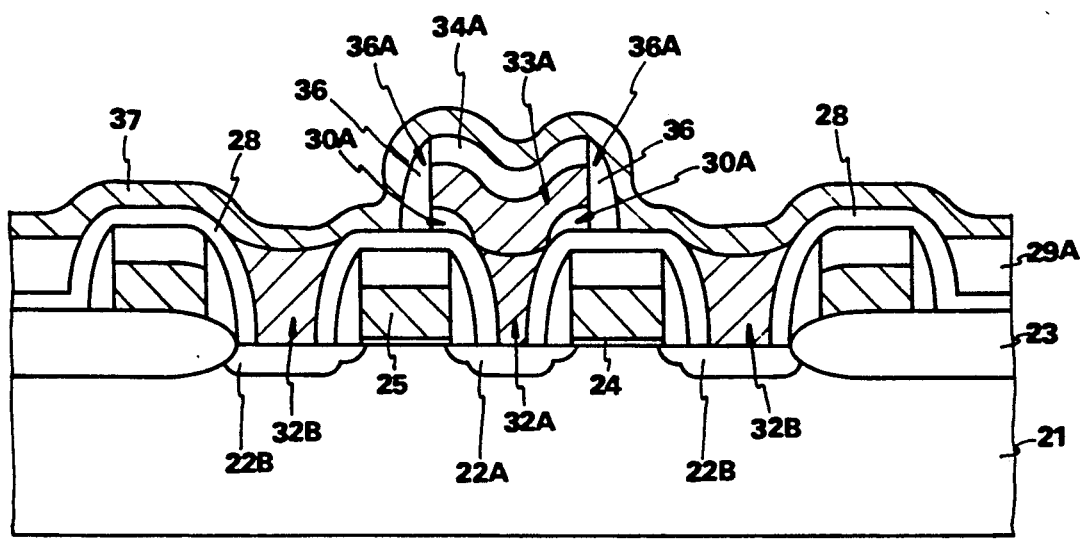

Next, a conducting layer 37 for the charge storage node is deposited over the top of the entire structure and contacted to the contact pad 32B for the charge storage node that has been exposed. This process is illustrated in FIG. 2H. Said conducting layer 37 for the charge storage node is patterned to form a pattern of the charge storage node in the later process.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments which fall within the true scope of the invention.

What is claimed is:

1. A method of manufacturing a contact of a highly integrated semiconductor device, comprising the steps of:
   forming a MOS transistor having gate, source, and drain electrodes and a field oxide on a silicon substrate;
   forming a first insulating layer that completely covers said MOS transistor and field oxide;
   forming a polyimide pattern only on contact areas located on top of the source electrode and drain electrode after coating a photo-sensitive polyimide over the first insulating layer;
   forming a second insulating layer over the device, particularly on said polyimide pattern and then forming a second insulating layer pattern by carrying out an etch back process until a surface of said polyimide pattern is exposed;
   removing the exposed polyimide pattern using a plasma etching process;
   forming a spacer on side walls of the gate electrode by carrying out a blanket etching process on the first insulating layer that has been exposed by said plasma etching process while simultaneously forming contact areas where the source electrode and the drain electrode are exposed;
   depositing a polysilicon layer over the second insulating layer pattern and forming several polysilicon pads that are in contact with the drain electrode or the source electrode by carrying out an etch back process until a surface of the second insulating layer pattern is exposed;
   depositing a third insulating layer over the device, including said polysilicon pads; and
   exposing each of said several polysilicon pads by removing a portion of the third insulating layer and depositing a conducting layer in contact with the exposed polysilicon pad.

2. The method according to claim 1 wherein said second insulating layer comprises a Low Temperature Oxide layer.

3. The method according to claim 1 wherein said second insulating layer comprises a Plasma Enhanced Chemical Vapor Deposition oxide layer.

4. The method according to claim 1 wherein said second insulating layer comprises a Spin-On-Glass layer.

5. The method according to claim 1 wherein said second insulating layer comprises a Boro-Phospho-Silicate Glass layer.

6. The method according to claim 1 wherein said second insulating layer comprises a TEOS.

7. The method according to claim 1 wherein said conducting layer in contact with the polysilicon pads is a bit line.

8. The method according to claim 1 wherein said conducting layer in contact with the polysilicon pads is a conducting layer for a charge storage node.

9. The method according to claim 1 wherein a photoresist instead of the photo-sensitive polyimide formed over said first insulating layer is used.

10. The method according to claim 9 wherein said second insulating layer comprises a Low Temperature Oxide layer.

11. The method according to claim 9 wherein said second insulating layer comprises a Plasma Enhanced Chemical Vapor Deposition oxide layer.

12. The method according to claim 9 wherein said second insulating layer comprises a Spin-On-Glass layer.

13. The method according to claim 9 wherein said second insulating layer comprises a Boro-Phospho-Silicate Glass layer.

14. The method according to claim 9 wherein said second insulating layer comprises a TEOS.

15. The method according to claim 9 wherein said conducting layer in contact with the polysilicon pads is a bit line.

16. The method according to claim 9 wherein said conducting layer in contact with the polysilicon pads is a conducting layer for a charge storage node.

17. A method of manufacturing a contact of a highly integrated semiconductor device, comprising the steps of:
   forming a MOS transistor having gate, source and drain electrodes, and a field oxide on a silicon substrate;
   forming a first insulating layer that completely covers said MOS transistor and field oxide;
   forming a second insulating layer over the first insulating layer and etching the second insulating layer until a surface of the first insulating layer is exposed by carrying out an etch back process in which the etch selectivity to the second insulating layer is higher than that of the first insulating layer;
   depositing a third insulating layer over the device and, using a mask patterning process, removing portions of the third insulating layer located on contact areas for a bit line and a charge storage node;

forming a first insulating layer spacer on side walls of the third insulating layer adjacent the contact areas;

forming a contact hole by removing the second insulating layer that has been exposed and the first insulating layer located below the exposed second insulating layer; and depositing a doped polysilicon layer over the device to fill said contact hole and etching back the doped polysilicon layer to form a polysilicon contact pad on the contact hole.

18. The method according to claim 17 further comprising the steps of:

sequentially depositing a bit line conducting layer and a mask insulating layer over the device after forming said contact pad and forming a bit line and a mask insulating layer pattern by carrying out a mask patterning process; and depositing a conducting layer for a charge storage node in contact with the contact pad for a charge storage node after forming a second insulating layer spacer on side walls of said bit line, and then forming a charge storage node by carrying out a mask patterning process.

19. The method according to claim 17 wherein said first insulating layer is made of silicon oxide.

20. The method according to claim 17 wherein said first insulating layer is made of silicon nitride.

21. The method according to claim 17 wherein said second insulating layer is made of BPSG.

22. The method according to claim 17 wherein said etching step for the second insulating layer is carried out using a NH$_4$OH cleaning process.

23. The method according to claim 17 wherein said etching step for the second insulating layer is carried out using a HF dip process.

24. The method according to claim 10 wherein said etching step for the second insulating layer is carried out using a B.O.E dip process.

* * * * *